US008242561B2

(12) United States Patent
Anderson et al.

(10) Patent No.: US 8,242,561 B2
(45) Date of Patent: Aug. 14, 2012

(54) SEMICONDUCTOR DEVICES WITH IMPROVED SELF-ALIGNED CONTACT AREAS

(75) Inventors: Brent A. Anderson, Jericho, VT (US); Andres Bryant, Burlington, VT (US); Edward J. Nowak, Essex Junction, VT (US); Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 215 days.

(21) Appl. No.: 12/702,684

(22) Filed: Feb. 9, 2010

(65) Prior Publication Data

US 2011/0193163 A1 Aug. 11, 2011

(51) Int. Cl.
*H01L 29/786* (2006.01)

(52) U.S. Cl. . 257/347; 257/369; 257/384; 257/E29.286; 257/E21.415; 438/151; 438/682

(58) Field of Classification Search .................. None
See application file for complete search history.

(56) References Cited

U.S. PATENT DOCUMENTS

| | | | |
|---|---|---|---|
| 6,933,183 B2 | 8/2005 | Beintner et al. | |
| 6,963,114 B2 | 11/2005 | Lin | |
| 7,105,894 B2 | 9/2006 | Yeo et al. | |
| 7,416,605 B2 * | 8/2008 | Zollner et al. | 117/89 |
| 7,456,471 B2 | 11/2008 | Anderson et al. | |
| 7,508,031 B2 | 3/2009 | Liu et al. | |
| 7,525,160 B2 | 4/2009 | Kavalieros et al. | |
| 7,525,161 B2 * | 4/2009 | Ieong et al. | 257/369 |
| 2006/0091490 A1 * | 5/2006 | Chen et al. | 257/458 |
| 2006/0244066 A1 | 11/2006 | Yeo et al. | |
| 2007/0194387 A1 * | 8/2007 | Dyer et al. | 257/369 |
| 2007/0287256 A1 | 12/2007 | Chang et al. | |
| 2008/0283934 A1 * | 11/2008 | Luo et al. | 257/384 |
| 2009/0095980 A1 | 4/2009 | Yu et al. | |
| 2009/0250772 A1 * | 10/2009 | Botula et al. | 257/408 |
| 2011/0037125 A1 * | 2/2011 | Cheng et al. | 257/351 |

* cited by examiner

*Primary Examiner* — Mamadou Diallo
(74) *Attorney, Agent, or Firm* — Cantor Colburn LLP; Michael LeStrange

(57) ABSTRACT

A field effect device includes a channel region disposed on a silicon on insulator (SOI) layer, a gate portion disposed on the channel region, a source region disposed on the SOI layer and connected to the channel region having a horizontal surface and a vertical surface, the vertical surface arranged perpendicular to a linear axis of the device, a silicide portion that includes the horizontal surface and vertical surface of the source region, a contact including a metallic material in contact with the horizontal surface and vertical surface of the source region, and a drain region connected to the channel region disposed on the SOI layer.

19 Claims, 15 Drawing Sheets

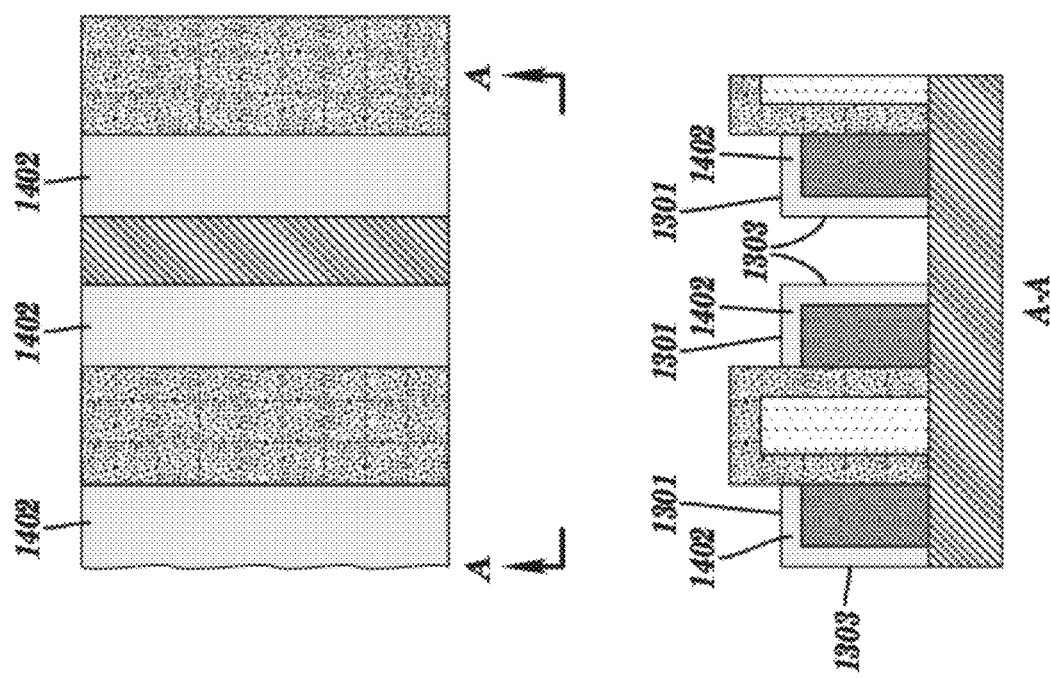

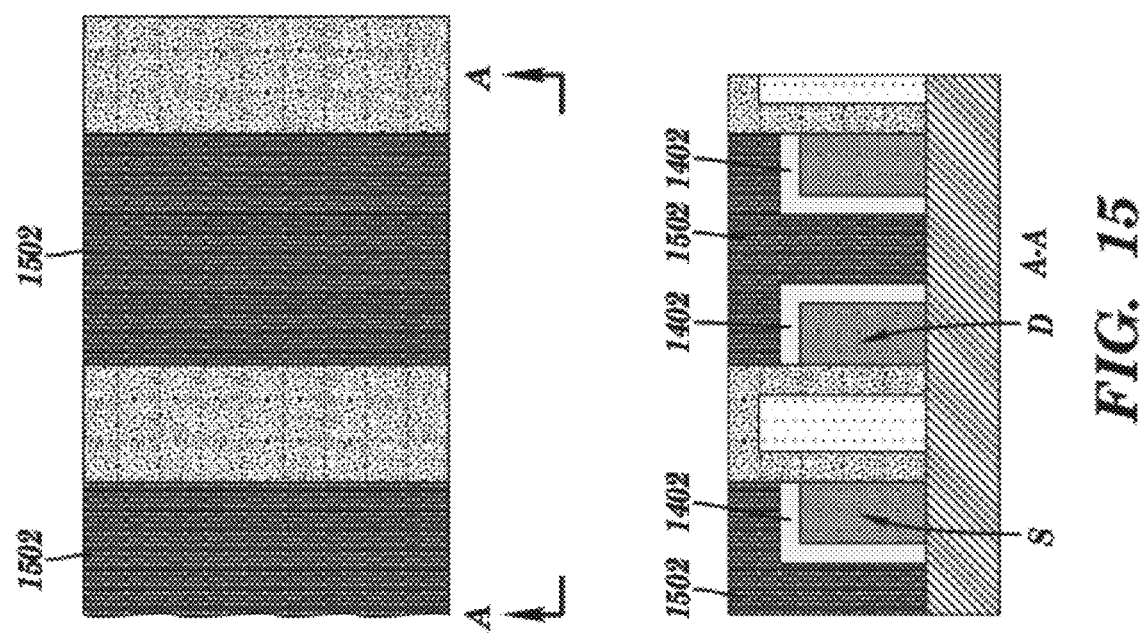

SEMICONDUCTOR DEVICES WITH IMPROVED SELF-ALIGNED CONTACT AREAS

BACKGROUND

The present invention relates generally to semiconductor device manufacturing and, more particularly, to field effect transistor (FET) devices and FinFET devices with improved self-aligned contact areas.

Semiconductor devices such as, FETs and FinFETs include regions such as, for example, source and drain regions connected to a gate structure, and in FinFET devices, fin structures that may include portions of the source and drain regions of the device. The source and drain regions are electrically connected to metallic contact material. The source and drain regions and fin structures often include silicide portions that promote electrical connectivity between the metallic contact material and the silicon of the source and drain regions.

BRIEF SUMMARY

According to one embodiment of the present invention, a field effect device includes a channel region disposed on a silicon on insulator (SOI) layer, a gate portion disposed on the channel region, a source region disposed on the SOI layer and connected to the channel region having a horizontal surface and a vertical surface, the vertical surface arranged perpendicular to a linear axis of the device, a silicide portion that includes the horizontal surface and vertical surface of the source region, a contact including a metallic material in contact with the horizontal surface and vertical surface of the source region, and a drain region connected to the channel region disposed on the SOI layer.

According to another embodiment of the present invention a method for forming a field effect device includes forming a gate portion on a silicon on insulator (SOI) layer, forming spacers on the SOI layer on opposing sides of the gate stack portion, forming a silicon layer on the SOI layer, removing portions of the silicon layer and the SOI layer to define a source region having a horizontal surface and a vertical surface, forming a silicide portion on the horizontal surface and the vertical surface of the source region, and depositing a metallic material in contact with the horizontal surface and vertical surface of the silicide portion of the source region.

A method for forming a field effect device includes forming a FinFET body of the device on a silicon on insulator (SOI) layer, the body having a source region, a drain region, and a channel region extending therebetween, forming a gate portion on the channel region, forming a spacer that covers the gate portion, a portion of the source region, a portion of the drain region, and a portion of the SOI layer, removing a portion of the source region to define a vertical surface of the source region perpendicular to a longitudinal axis of the body, and forming a silicide portion on the vertical surface of the source region.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 11-15 illustrate an alternate exemplary method for forming an alternate exemplary embodiment of a FinFET device.

DETAILED DESCRIPTION

Field effect transistor devices having a gate, source region, and drain region may include source and drain regions having silicide portions in contact with metallic contacts. The silicide portions improve the electrical connection between silicon source and drain regions and metallic contacts. The effectiveness of the silicide portions may be improved by increasing the surface area of the silicide portions in proximity to the gate.

Figure 1:
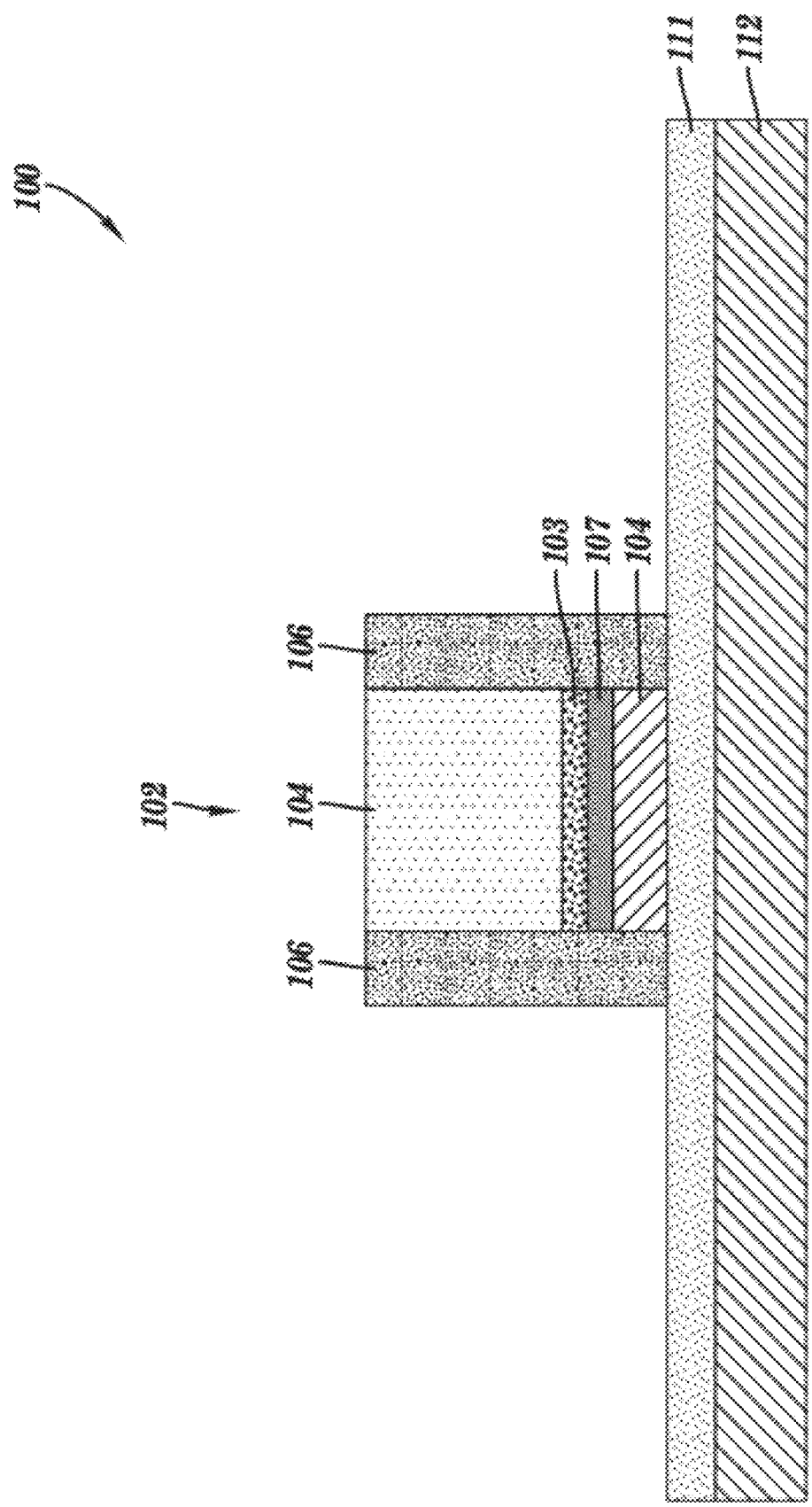
FIGS. 1-5 illustrate a cross-sectional view of an exemplary method for forming an exemplary embodiment of a FET device.

FIGS. 1-5 illustrate a cross-sectional view of an exemplary method for forming an exemplary embodiment of a FET device 100. Referring to FIG. 1, the device 100 includes a gate stack portion 102 disposed on a hardmask portion 104. The gate stack portion 102 may include, for example a polysilicon layer 105, a metal gate 103, and a high K layer 107 disposed on a thin silicon on insulator (SOI) layer 111. The SOI layer is disposed on a buried oxide (BOX) substrate 112. Spacers 106 are formed adjacent to the gate stack portion 102. The spacers 106 may be formed from, for example, a layer of Silicon nitride (SiN), or Silicon Oxide ($SiO_2$) deposited conformally that is anisotropically etched to form the spacers 106. In the illustrated embodiment, the SOI layer 111 is approximately 3 nm thick however; other embodiments may include a SOI layer 111 having a different thickness.

Figure 2:
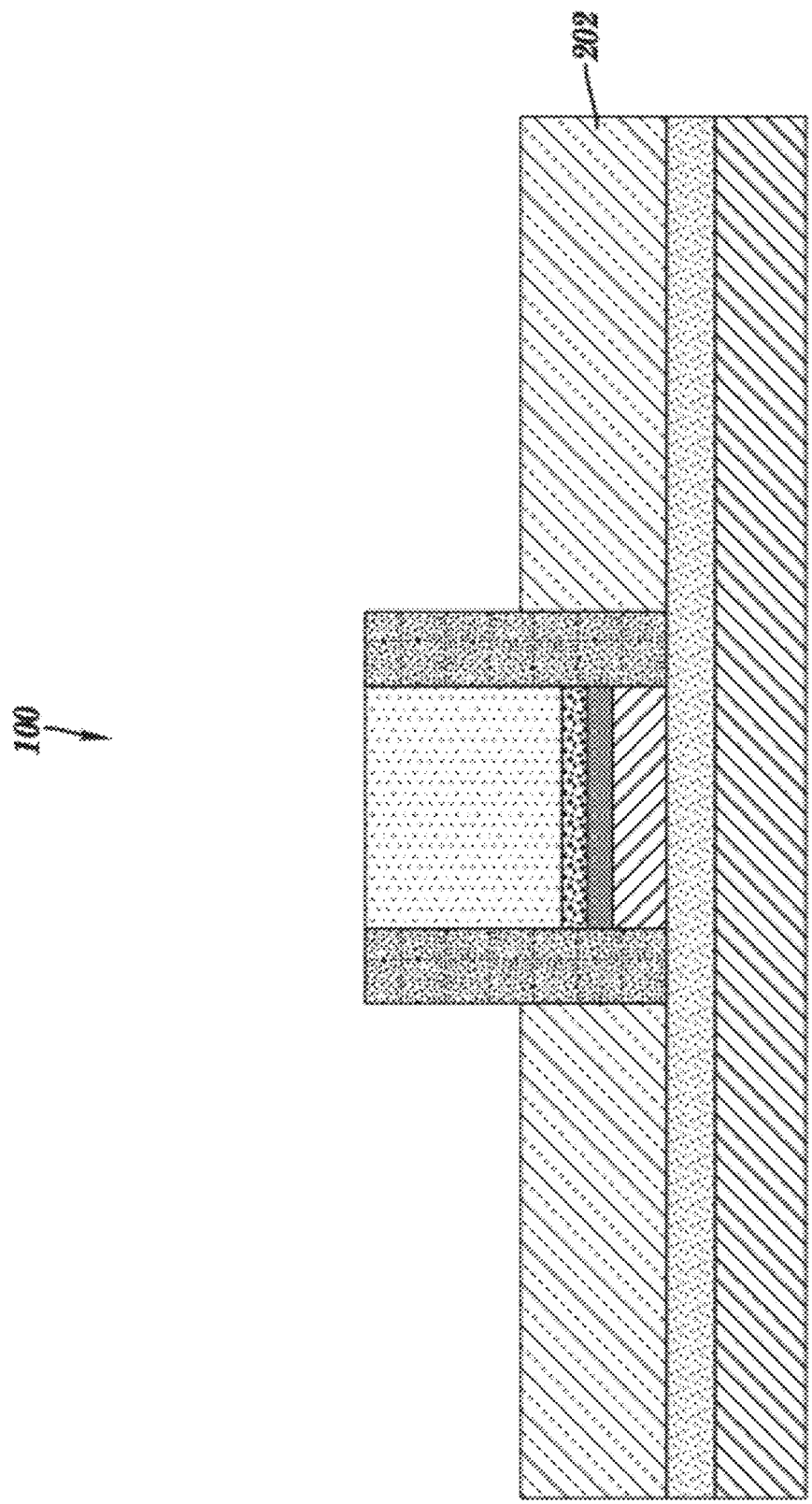

FIG. 2 illustrates an epitaxially grown silicon layer (epi-silicon layer) 202 that is grown on the SOI layer 111. In the illustrated embodiment, the epi-silicon layer 202 is approximately 15 nm thick however; other embodiments may include an epi-silicon layer 202 having a different thickness.

Figure 3:
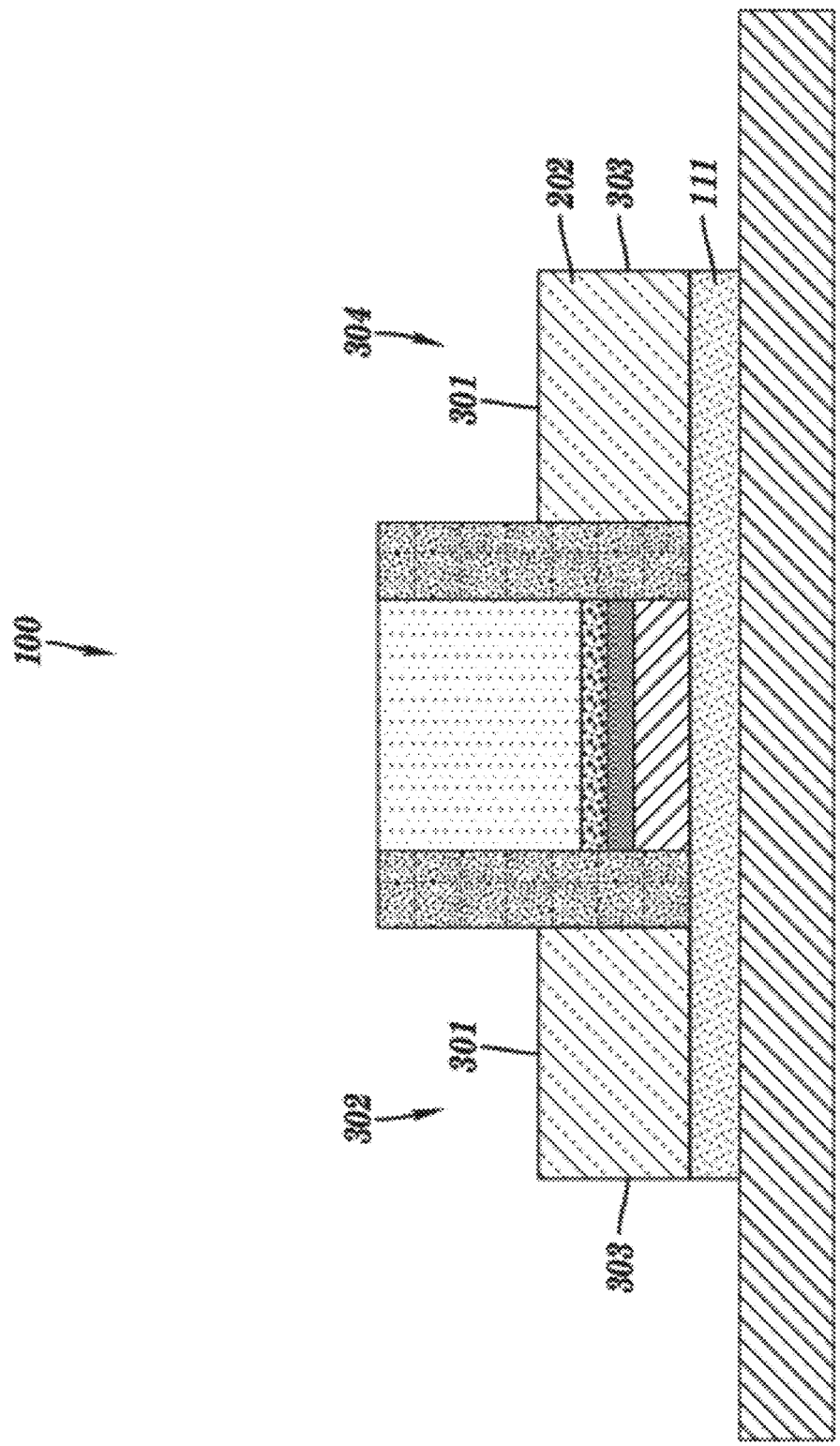

FIG. 3 illustrates an example of the resultant structure following an etching process such as, a lithographic masking and anisotropic chemical etching process, or a reactive ion etching (RIE) process. In the illustrated embodiment, portions of the epi-silicon layer 202 and the SOI layer 111 have been removed to form a source region 302 and a drain region 304. The source region 302 and drain region 304 each include an exposed horizontal surface 301 and an exposed vertical surface 303. In the illustrated embodiment, the source and drain regions 302 and 304 are approximately 10 nm wide, however other embodiments may have different widths. The source regions 302 and drain regions 304 may be doped by implanting ions prior to the epitaxial growth of the epi-silicon layer 202. Alternatively, ion implantation of the source regions 302 and the drain regions 304 may be performed following the epitaxial growth of the epi-silicon layer 202.

Figure 4:
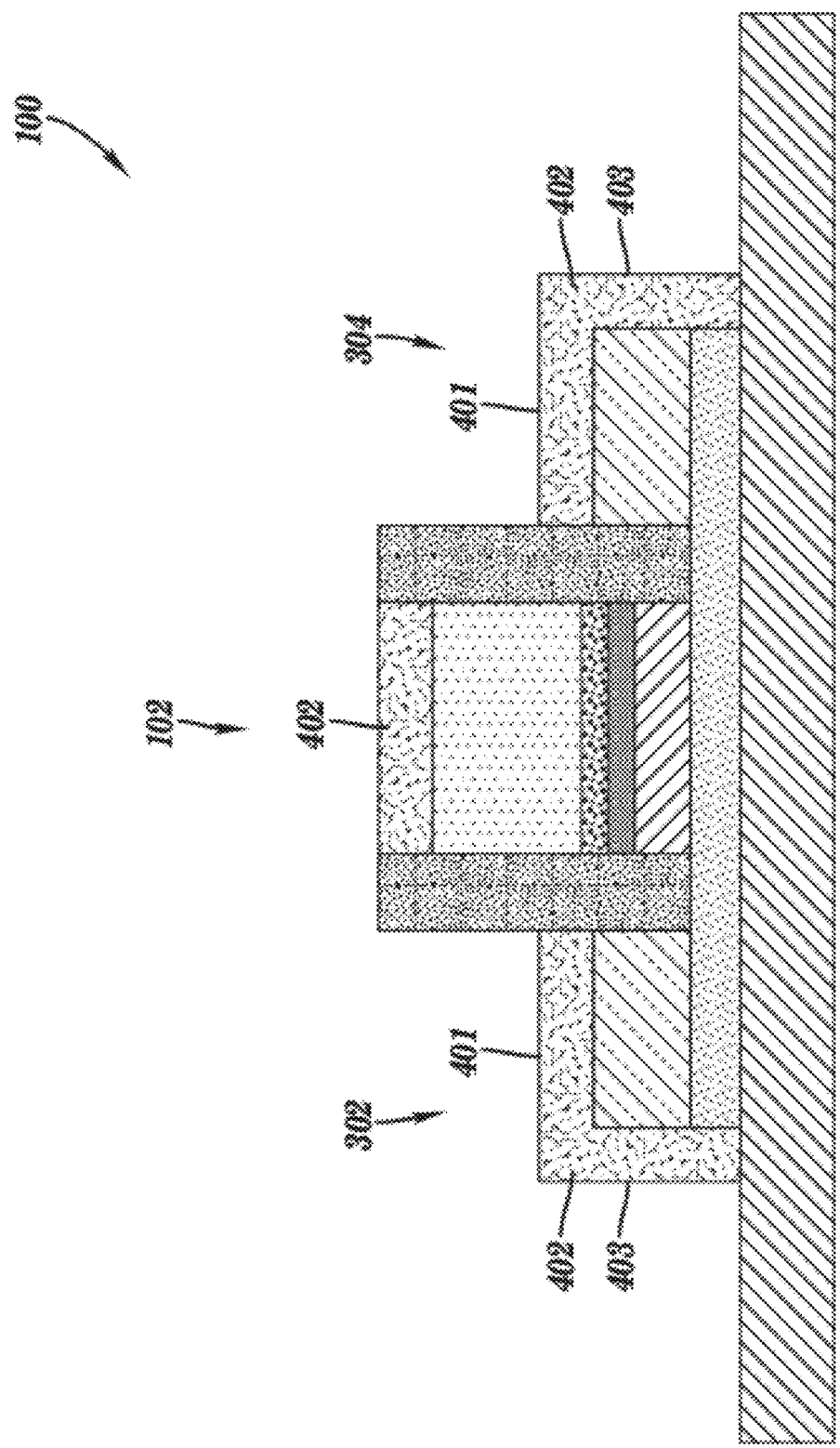

FIG. 4 illustrates an example of the resultant structure following silicidation of portions of the source and drain regions 302 and 304 and the gate stack portion 102. In FIG. 4, silicide regions 402 including, for example, nickel silicide, tungsten silicide, or titanium silicide are formed on the exposed horizontal surfaces 302 and the exposed vertical surfaces 303 in the source and drain regions 302 and 304. Resulting in silicide regions 402 having orthogonal horizontal portions 401 and vertical portions 403. The silicidation process may include, for example, the deposition of a metal such as titanium, cobalt or nickel, as well as alloys further including platinum or erbium, followed by a thermal anneal at temperatures sufficiently high to cause a chemical reaction of portions of the metal in contact with silicon regions, to form a metal silicide. The thermal anneal temperature may rage, for example, from 600° C. to 750° C. A selective etch removes remaining unreacted metal regions, to leave behind self-aligned metal silicide.

Figure 5:
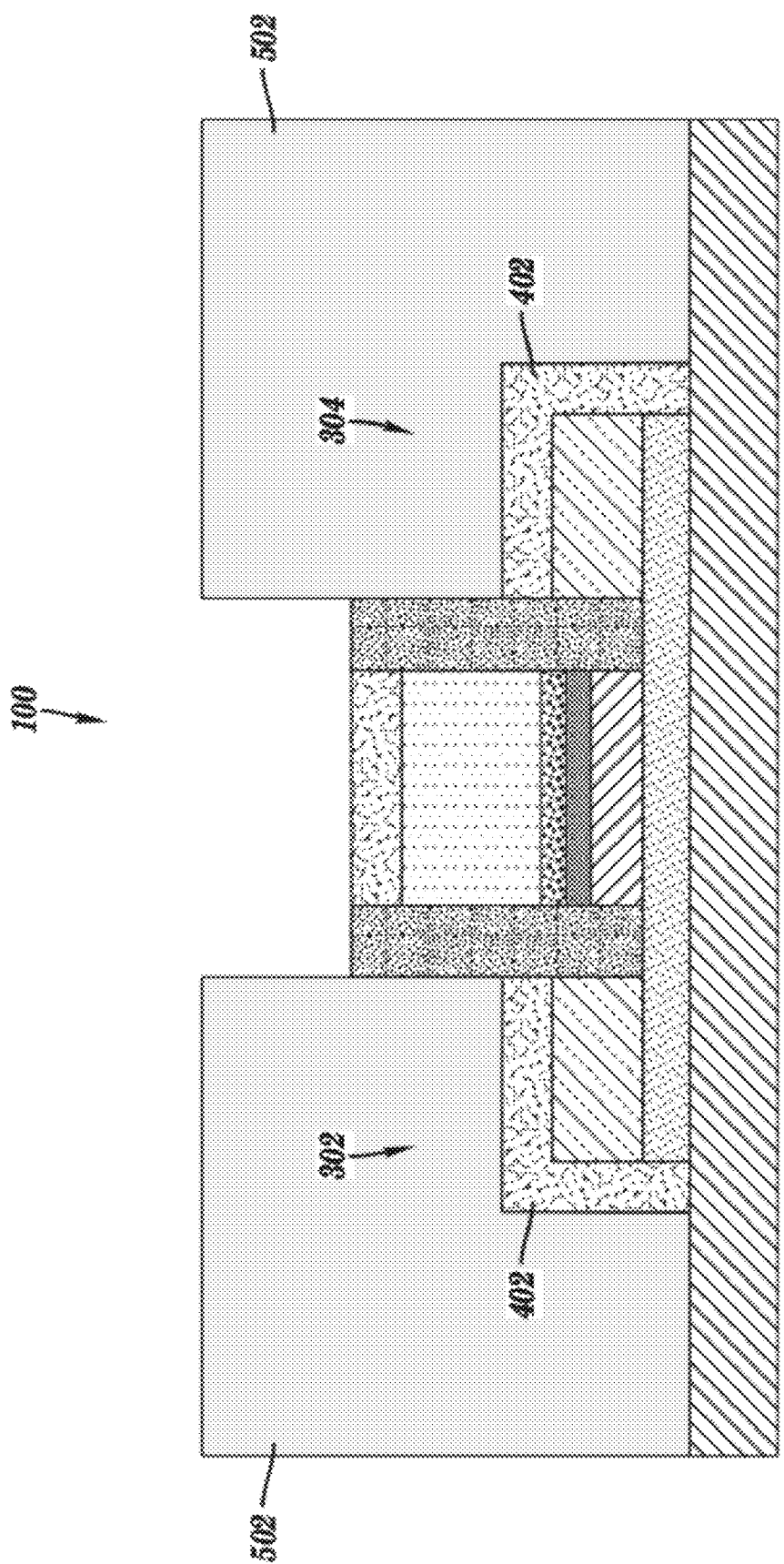

FIG. 5 illustrates an example of the resultant structure following the deposition of metallic contact material such as, for example, copper or tungsten that forms metallic contacts 502. The metallic contacts 502 are partially formed on the silicide regions 402 of the source and drain regions 302 and 304. The silicide regions 402 improve the electric connection between the source and drain regions 302 and 304 and the metallic contacts 502. The vertical portions 403 of the silicide regions 402 improve the effectiveness of the silicide regions 402 by increasing the surface area of the silicide regions 402 in proximity to the gate stack portion 102.

Electrical conduction from the silicide regions 402 to the highly doped source and drain regions 302 and 304 takes place by means of tunneling across a Schottkey barrier that may impede transistor drive currents. The large area of contact between the silicide and source/drain regions 302/304, reduces the resistance to the drive current—increasing the drive current.

Figure 6:
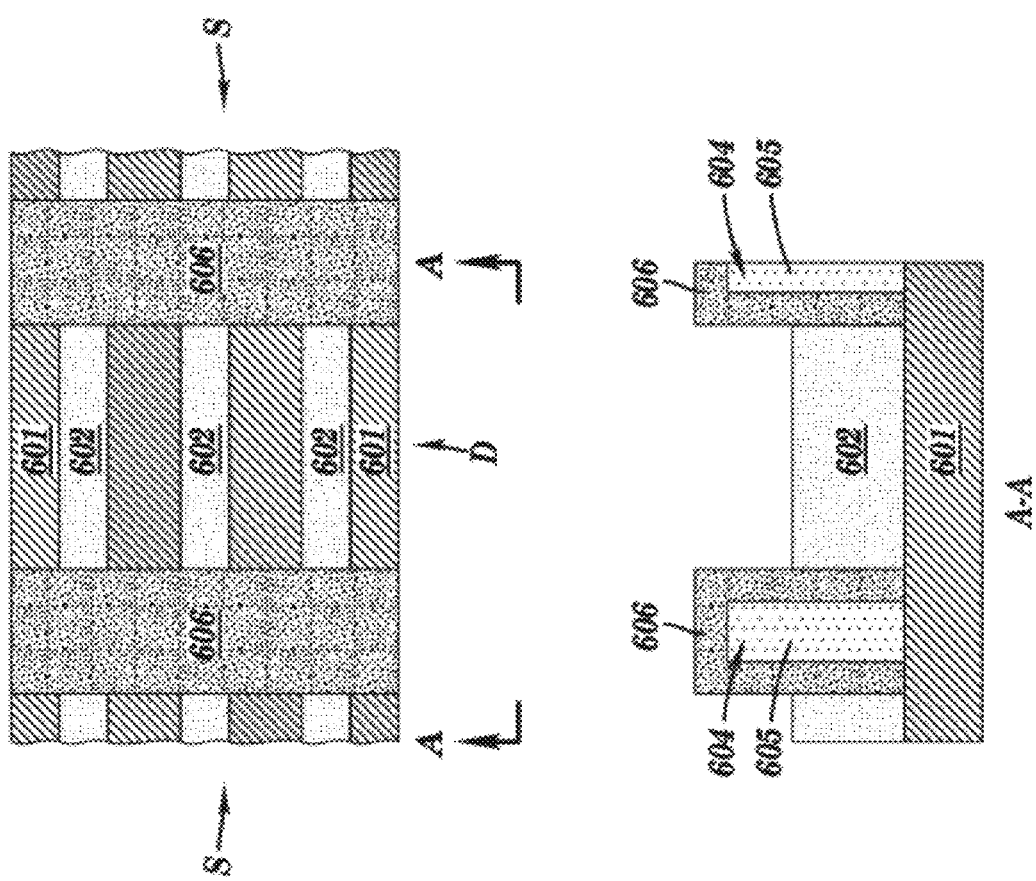
FIGS. 6-10 illustrate an exemplary method for forming an exemplary embodiment of a FinFET device.

FIGS. 6-10 illustrate an exemplary method for forming an exemplary embodiment of a FinFET device. FIG. 6 illustrates a top-down view of portions of a plurality of FinFET devices and a cross-sectional view along the line A-A. The illustrated embodiment includes a plurality of SOI fin portions 602 formed on a BOX substrate 601 and gate portions 604. The fin portions 602 shown in FIG. 6 form a body of the device and source (S) or a drain (D) regions of a plurality of FinFet devices. The gate portions 604 are formed in a channel region of the fin portions 602 that is between the source and drain regions by, for example, depositing a first gate dielectric layer (not shown) such as, for example, silicon dioxide (SiO$_2$) around a portion of the fin portions 602. A second gate dielectric layer (not shown) such as, for example, a hafnium compound (e.g. HfO$_2$) is formed around the silicon oxide layer. A metal layer 605 such as, for example, tantalum nitride (TaN), or titanium nitride (TiN), is formed around the second gate dielectric layer. Spacers 606 including, for example, a silicon nitride material are formed on the gate portions 604.

Figure 7:
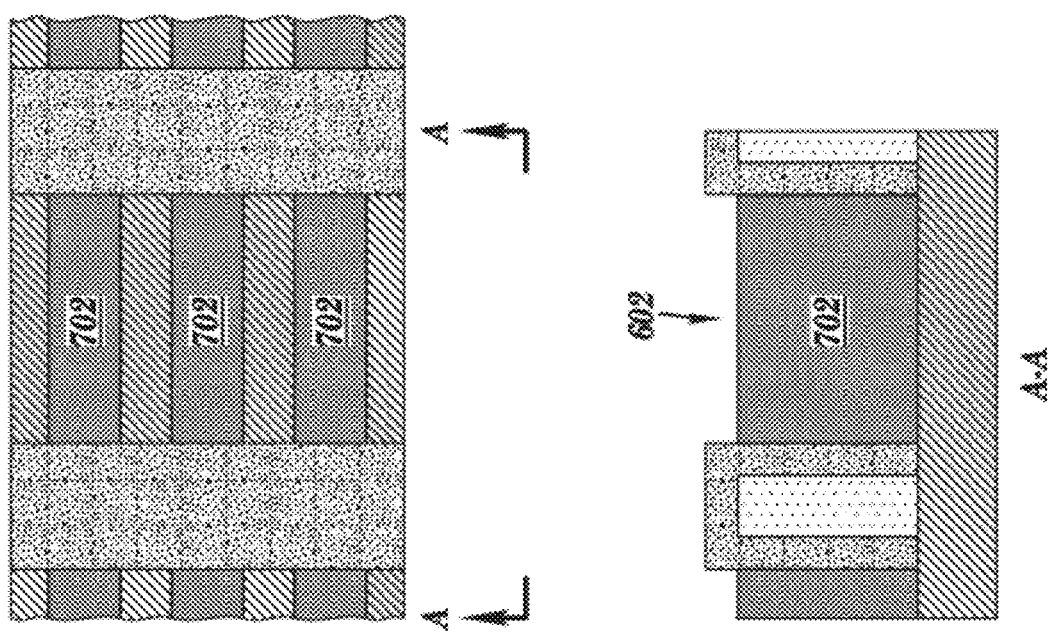

FIG. 7 illustrates an example of the resultant structure with an epitaxially grown silicon layer (epi-silicon layer) 702 formed on the fin portions 602. The epi-silicon layer 702 increases the size of the fin portions 602. In alternate embodiments, the epi-silicon layer 702 may not be grown if, for example, the size of the fin portions 602 meet design specifications without an epitaxial growth. The fin portions 602 may be doped with, for example, n-type dopants (e.g., arsenic, antimony, or phosphorus) or p-type dopants (e.g., boron, gallium, or indium) for the source and drain regions prior to the growth of the epi-silicon layer 702, or alternatively, after the growth of the epi-silicon layer 702.

Figure 8:
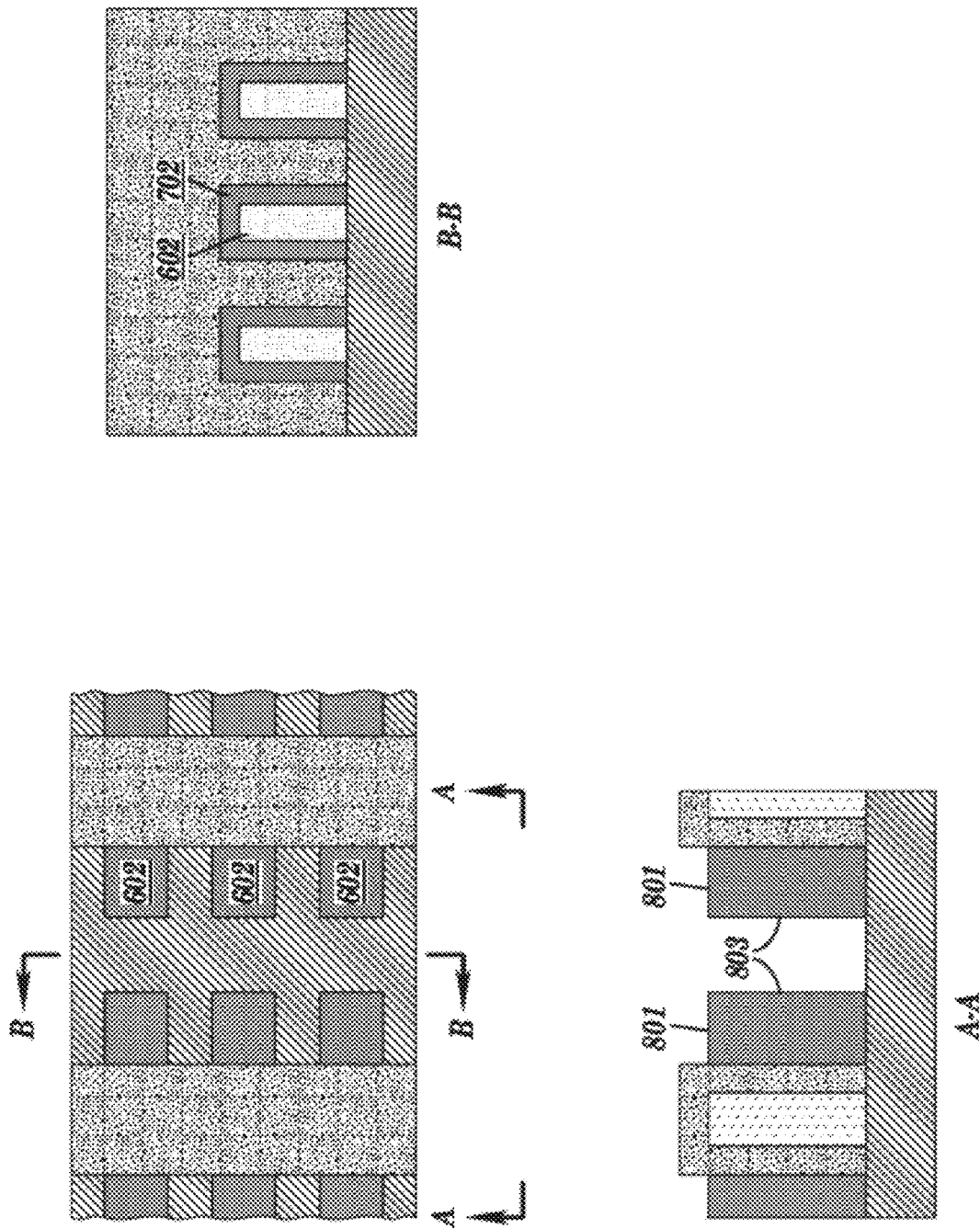

FIG. 8. illustrates an example of the resultant structure including cross-sectional views along the lines A-A and B-B following an etching process such as, for example, a chemical etching or RIE etching process. The etching process removes portions of the fin portions 602, resulting in each fin having a horizontal surface 801 and a vertical surface 803.

Figure 9:
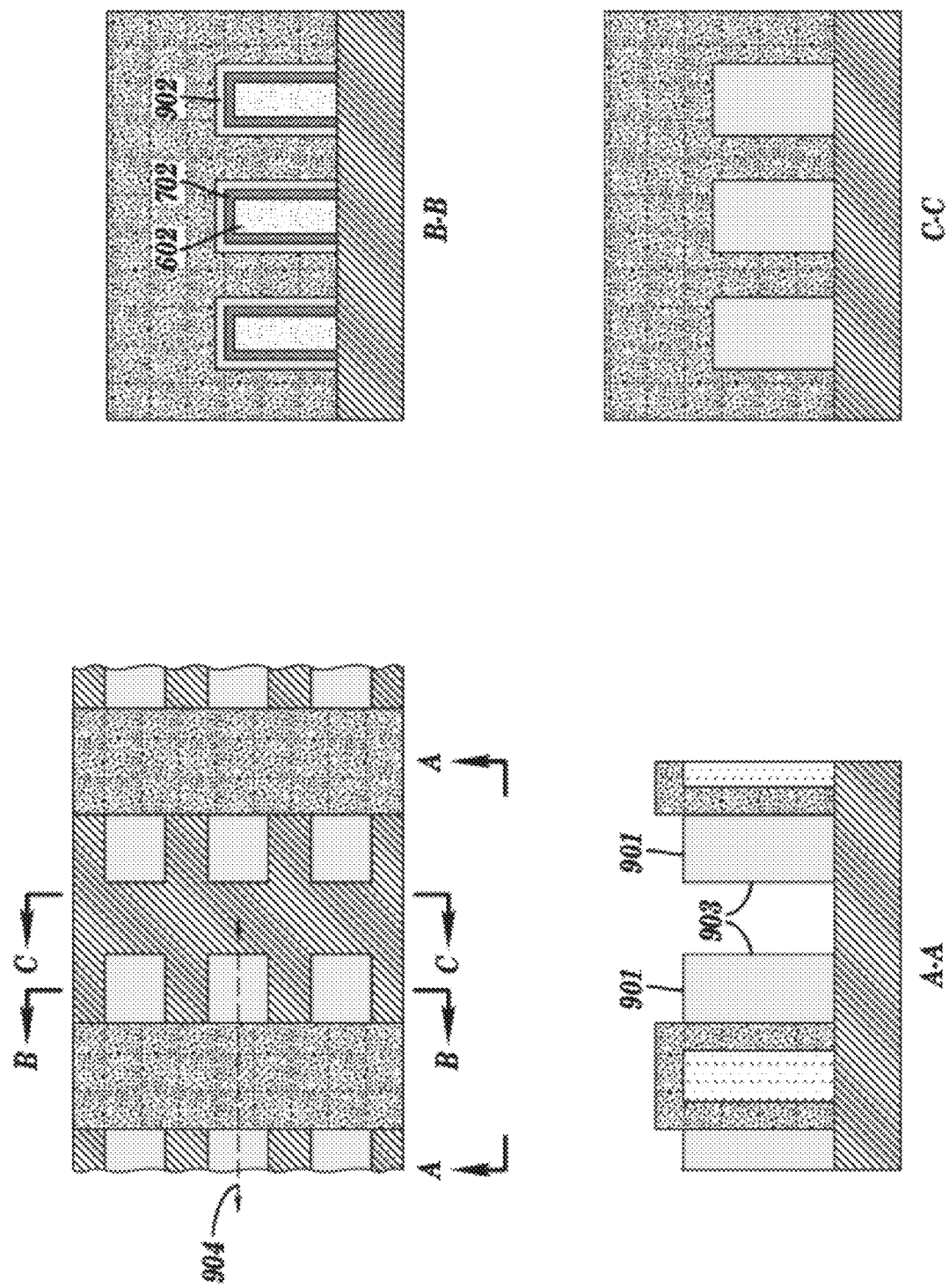

FIG. 9 illustrates an example of the resultant structure including cross-sectional views along the lines A-A, B-B, and C-C following silicidation of portions of the fin portions 602 in a method similar to the silicidation methods described above. The silicidation method forms silicide portions 902 on epi-silicon layer 702 of the fin portions 602. The silicide portions 902 are formed on the horizontal surfaces 801 and the vertical surfaces 803 (of FIG. 8) of the fin portions 602 resulting in each fin portion 602 having horizontal silicide portions 901 and a vertical silicide portions 903 arranged orthogonally. The vertical silicide portions 903 are arranged perpendicularly to the longitudinal axis 904 of the fin portions 602.

Figure 10:
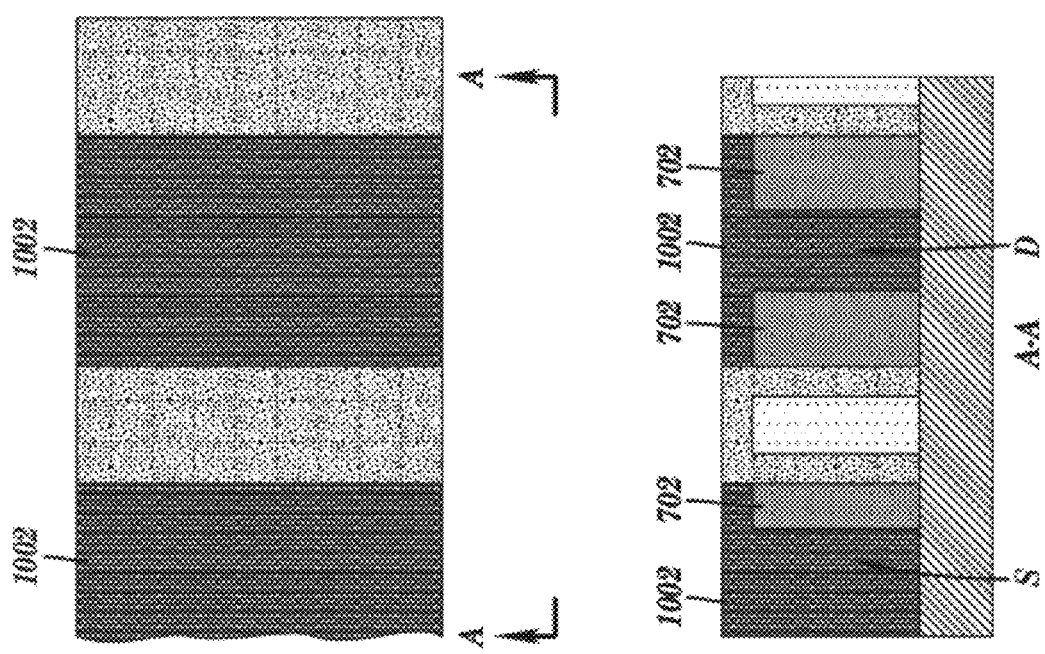

FIG. 10 illustrates an example of the resultant structure following the deposition of metallic contact material, such as, for example, copper or silver that forms metallic contacts 1002. The metallic contacts 1002 are partially formed on the silicide regions 702 of the fin portions 602. The silicide regions 702 improve the electric connection between fin portions 602 having a source region (S) and drain region (D) and the metallic contacts 1002.

Figure 11:
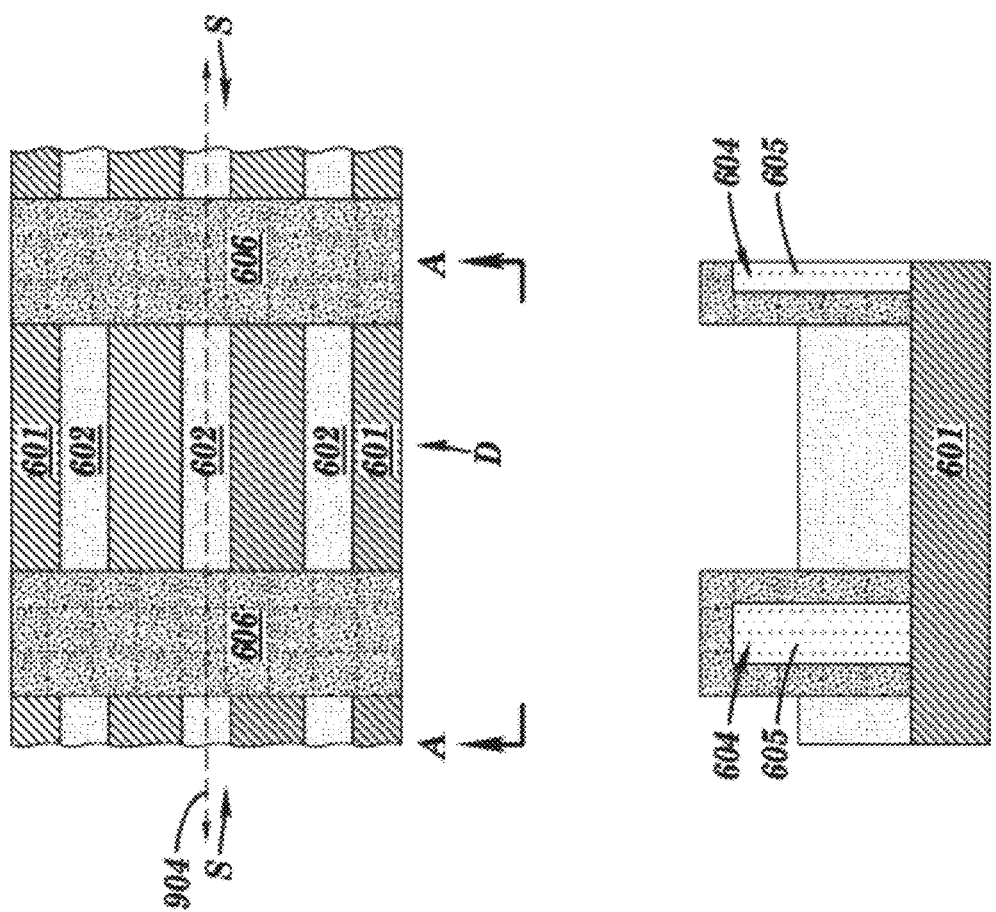

FIGS. 11-15 illustrate an alternate exemplary method for forming an alternate exemplary embodiment of a FinFET device. FIG. 11 illustrates a top-down view of portions of a plurality of FinFET devices and a cross-sectional view along the line A-A. The illustrated embodiment is similar to the embodiment in FIG. 6 described above, and includes a plurality of SOI fin portions 602 formed on a BOX substrate 601 and gate portions 604 formed on a channel region of the fin portions 602 between the source and drain regions. The fin portions 602 shown in FIG. 6 form a body of the device and source (S) or a drain (D) regions of a plurality of FinFet devices. The metal layer 605 is formed around the second gate dielectric layer (not shown). The spacers 606 including are formed on the gate portions 604.

Figure 12:
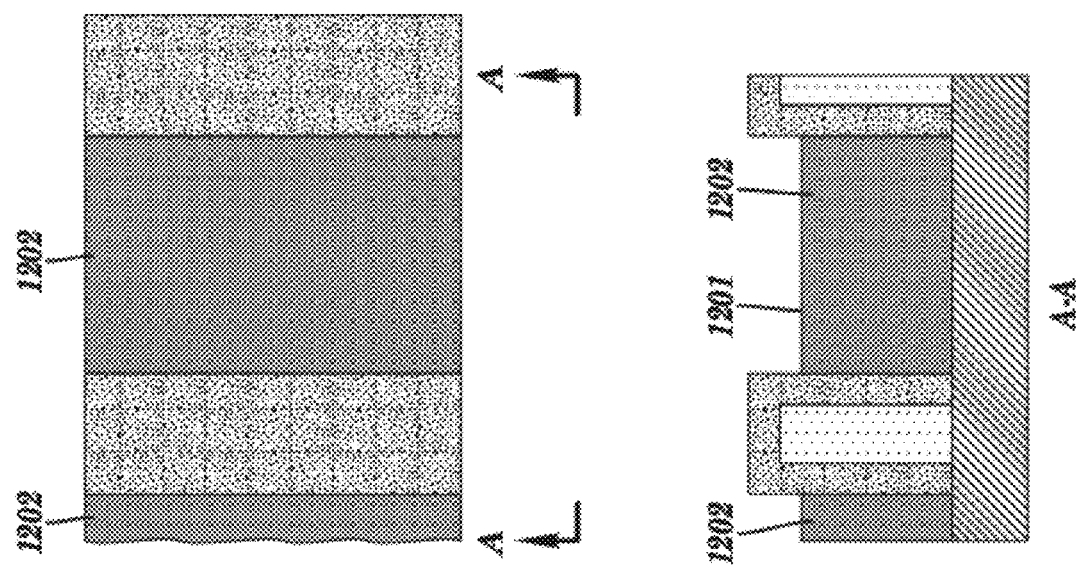

FIG. 12 illustrates an example of the resultant structure following an epitaxial growth of an epi-silicon layer 1202 over the fin portions 602. The epi-silicon layer has a horizontal surface 1201.

Figure 13:
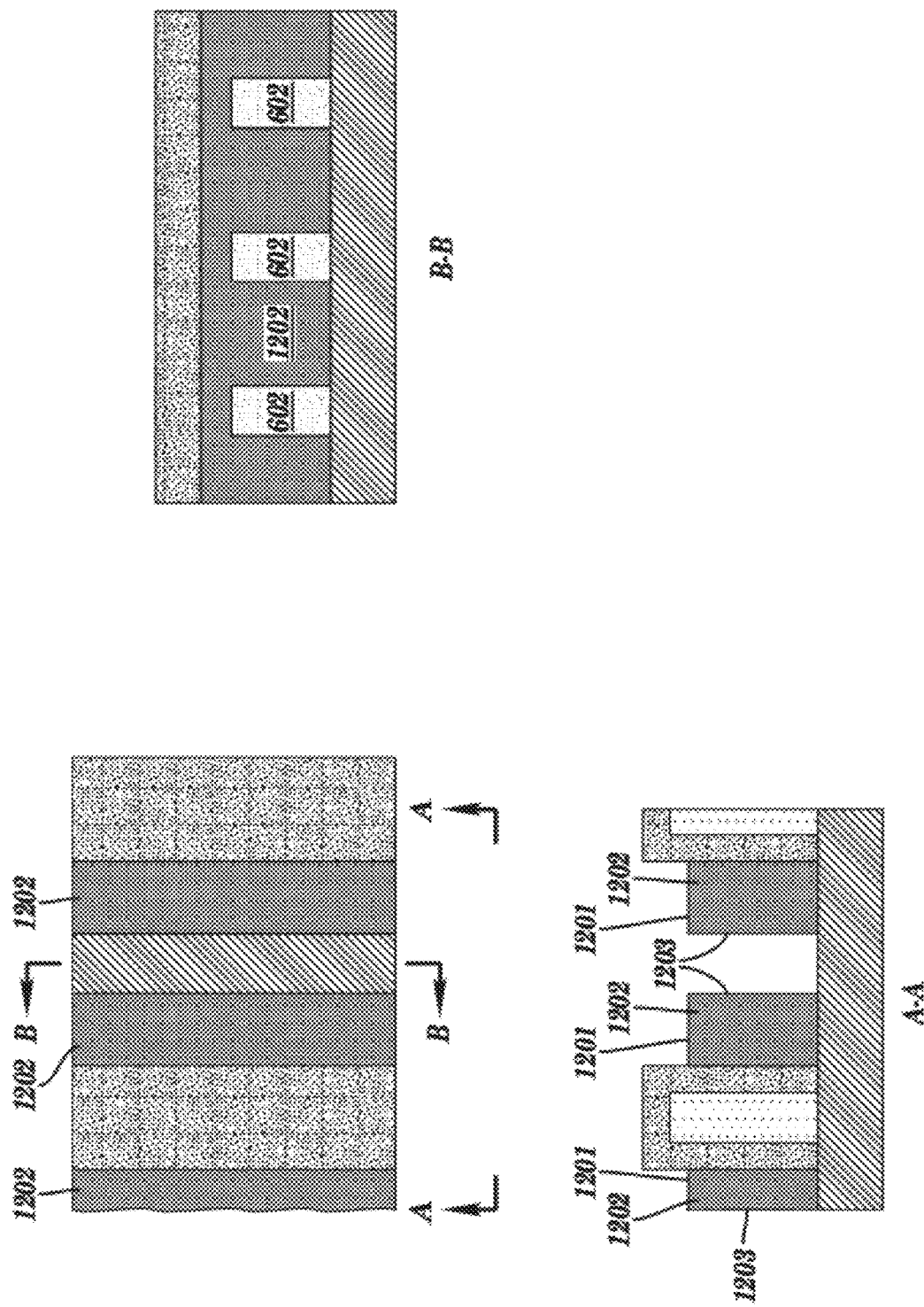

FIG. 13 illustrates an example of the resultant structure following the removal of a portion of the epi-silicon layer 1202 and the fin portions 602 following an etching process such as, for example, a chemical or RIE etching process. The etching process defines vertical surfaces 1203 in the epi-silicon layer 1202 and the fin portions 602. After the fin portions 602 are defined, the fin portions 602 may be doped by ion implantation in a method similar to the doping methods described above to form source and drain regions in the device.

FIG. 14 illustrates an example of the resultant structure following the silicidation of portions of the fin portions 602 and the epi-silicon layer 1202 in a method similar to the silicidation methods described above. The silicidation method forms silicide portion 1402 on epi-silicon layer 1202 and exposed portions of the fin portions 602. The silicide portion 1402 are formed on the horizontal surfaces 1201 and the vertical surfaces 1203 (of FIG. 13) resulting in the epi-silicon layer 1202 having a horizontal silicide portion 1301; and the epi-silicon layer 1202 and the exposed areas of the fin portions 602 having a vertical silicide portion 1303.

FIG. 15 illustrates an example of the resultant structure following the deposition of metallic contact material, such as, for example, copper or silver that forms metallic contacts 1502. The metallic contacts 1502 are partially formed on the silicide portions 1402 of the epi-silicon layer 1202 and the fin portions 602. The silicide portions 1402 improve the electric connection between the epi-silicon layer 1202 and the fin portions 602 having a source region (S) and drain region (D) and the metallic contacts 1402.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A field effect device comprising:
   a channel region disposed on a silicon on insulator (SOI) layer;
   a gate portion disposed on the channel region;
   a source region disposed above the SOI layer and connected to the channel region having a horizontal surface and a vertical surface, the vertical surface arranged perpendicular to a linear axis of the device;
   a silicide portion that includes the horizontal surface and vertical surface of the source region;
   a contact including a metallic material in contact with the horizontal surface and vertical surface of the source region; and
   a drain region connected to the channel region disposed on the SOI layer.

2. The device of claim 1, wherein the drain region includes:
   a silicide portion that includes a horizontal surface and a vertical surface of the drain region, the vertical surface arranged perpendicular to a linear axis of the device; and
   the device includes a second contact including a metallic material in contact with the horizontal surface and vertical surface of the drain region.

3. The device of claim 1, wherein the gate portion includes:
   a high K layer disposed on the SOI layer;
   a metal gate disposed on the high K layer; and
   a polysilicon layer disposed on the metal gate.

4. The device of claim 1, wherein the field effect device is a FinFET device, and the channel region, the source region, and the drain region define a fin of a FinFET device.

5. The device of claim 4, wherein the gate portion includes:
   first gate dielectric layer disposed on the channel region;
   a silicon oxide layer disposed on the first gate dielectric layer;
   a second gate dielectric layer disposed on the silicon oxide layer; and
   a metal layer disposed on the second gate dielectric layer.

6. A method for forming a field effect device comprising:
   forming a gate portion on a silicon on insulator (SOI) layer, the SOI layer arranged on a substrate;
   forming spacers on the SOI layer on opposing sides of the gate stack portion;
   forming a silicon layer on the SOI layer;
   removing portions of the silicon layer and the SOI layer and exposing the substrate to define a source region having horizontal surface and a vertical surface;
   forming a silicide portion on the horizontal surface and the vertical surface of the source region; and
   depositing a metallic material in contact with the horizontal surface and vertical surface of the silicide portion of the source region.

7. The method of claim 6, wherein the method further comprises:
   removing portions of the silicon layer and the SOI layer to define a drain region having a horizontal surface and a vertical surface;
   forming a silicide portion on the horizontal surface and vertical surface of the drain region; and
   depositing a metallic material in contact with the horizontal surface and vertical surface of the silicide portion of the drain region.

8. The method of claim 6, wherein the removed portions of the silicon layer and the SOI layer to define a source region having a horizontal surface and a vertical surface are removed by an etching process.

9. The method of claim 6, wherein the horizontal surface and vertical surface of the source region are arranged orthogonally.

10. The method of claim 6, wherein the gate portion includes:
    a high K layer disposed on the SOI layer;
    a metal gate disposed on the high K layer; and
    a polysilicon layer disposed on the metal gate.

11. A method for forming a field effect device comprising:
    forming a FinFET body of the device above a silicon on insulator (SOI) layer, the body having a source region, a drain region, and a channel region extending therebetween;
    forming a gate portion on the channel region;
    forming a spacer that covers the gate portion, a portion of the source region, a portion of the drain region, and a portion of the SOI layer;
    removing a portion of the source region to define an exposed vertical surface of the source region perpendicular to a longitudinal axis of the body; and
    forming a silicide portion on the exposed vertical surface of the source region.

12. The method of claim 11, wherein the method further includes:
    removing a portion of the drain region to define a vertical surface of the drain region perpendicular to a longitudinal axis of the body; and
    forming a silicide portion on the vertical surface of the drain region.

13. The method of claim 11, wherein the method further includes:
forming a silicide portion on a horizontal surface of the source region, the silicide portion on the horizontal surface of the source region is orthogonal to the silicide portion on the exposed vertical surface of the source region.

14. The method of claim 13, wherein the method further includes depositing a metallic material in contact with the vertical surface and the horizontal surface of the silicide portion of the source region.

15. The method of claim 12, wherein the method further includes:
forming a silicide portion on a horizontal surface of the drain region, the silicide portion on the horizontal surface of the source region is orthogonal to the silicide portion on the vertical surface of the drain region.

16. The method of claim 15, wherein the method further includes depositing a metallic material in contact with the vertical surface and the horizontal surface of the silicide portion of the drain region.

17. The method of claim 11, wherein the gate portion includes:
a high K layer disposed on the SOI layer;
a metal gate disposed on the high K layer; and
a polysilicon layer disposed on the metal gate.

18. The method of claim 11, wherein the removed portion of the source region to define a vertical surface of the source region perpendicular to a longitudinal axis of the body is removed by an etching process.

19. The method of claim 11, wherein the gate portion is formed by: disposing first gate dielectric layer on the channel region; disposing a silicon oxide layer on the first gate dielectric layer; disposing a second gate dielectric layer on the silicon oxide layer; and disposing a metal layer on the second gate dielectric layer.

* * * * *